United States Patent
Chen

(10) Patent No.: US 7,170,439 B1
(45) Date of Patent: Jan. 30, 2007

(54) SELF-CALIBRATION CIRCUIT FOR CAPACITANCE MISMATCH

(75) Inventor: Hsuan-Fan Chen, Taipei (TW)

(73) Assignee: Prolific Technology Inc., Taipei (TW)

( * ) Notice: Subject to any disclaimer, the term of this patent is extended or adjusted under 35 U.S.C. 154(b) by 0 days.

(21) Appl. No.: 11/307,007

(22) Filed: Jan. 19, 2006

(30) Foreign Application Priority Data

Nov. 10, 2005  (TW) ................ 94139397 A

(51) Int. Cl.
*H03M 1/12* (2006.01)
(52) U.S. Cl. ............... 341/172; 341/120; 341/118
(58) Field of Classification Search ......... 341/118, 341/117, 119, 172, 156, 120
See application file for complete search history.

(56) References Cited

U.S. PATENT DOCUMENTS

| | | | | |
|---|---|---|---|---|
| 4,399,426 A | * | 8/1983 | Tan ............... | 341/120 |
| 5,621,409 A | * | 4/1997 | Cotter et al. ......... | 341/156 |
| 5,684,487 A | * | 11/1997 | Timko ............. | 341/172 |
| 5,995,033 A | * | 11/1999 | Roeckner et al. ...... | 341/155 |
| 6,140,948 A | * | 10/2000 | Yu ................. | 341/118 |
| 6,448,911 B1 | * | 9/2002 | Somayajula ......... | 341/120 |

FOREIGN PATENT DOCUMENTS

| | | |
|---|---|---|
| TW | 1229354 | 3/2005 |
| TW | 1231098 | 4/2005 |
| TW | 1240800 | 10/2005 |

* cited by examiner

*Primary Examiner*—Jean Bruner Jeanglaude
(74) *Attorney, Agent, or Firm*—Jianq Chyun IP Office

(57) ABSTRACT

A self-calibration circuit for capacitance mismatch is provided. The circuit comprises a sample-and-hold (S/H) circuit, a comparator, and a switch control circuit. The S/H circuit comprises a compensation capacitor array, a target capacitor, and a reference capacitor. The S/H circuit provides an output voltage, wherein the output voltage is an operation result based on the capacitance of the target capacitor and the reference capacitor, and the equivalent capacitance of the compensation capacitor array. The comparator provides a comparison signal according to whether the output voltage of the S/H circuit is positive or negative. The switch control circuit controls the equivalent capacitance of the array according to the comparison signal such that the result of the target capacitance added to the equivalent capacitance of the array gradually approximates the reference capacitance with each cycle of a clock signal.

18 Claims, 5 Drawing Sheets

SELF-CALIBRATION CIRCUIT FOR CAPACITANCE MISMATCH

CROSS-REFERENCE TO RELATED APPLICATION

This application claims the priority benefit of Taiwan application serial no. 94139397, filed on Nov. 10, 2005. All disclosure of the Taiwan application is incorporated herein by reference.

BACKGROUND OF THE INVENTION

1. Field of Invention

The present invention relates to a self-calibration circuit for capacitance mismatch, and more particularly to an approximation self-calibration circuit for capacitance mismatch.

2. Description of Related Art

In integrated circuits (IC), capacitance match is always one of the important design considerations. In ICs, such as switch-capacitor circuits and digital-to-analog converters (DACs), etc., the performance of the circuits might be restricted due to capacitance mismatch resulting from deviation in the manufacturing process, such that the circuit cannot achieve the level of the original design. Therefore, with IC design, how to compensate the capacitance mismatch caused by deviation in the manufacturing process so as to enable the designed circuit to achieve the original performance and precision is a critical consideration.

In the conventional art, an additional capacitor array formed by connecting the original capacitors in parallel is generally utilized to compensate the capacitance mismatch. After the IC is formed, the designer measures the transfer function of the circuit output to determine the amount of capacitance mismatch/deviation, then the capacitor array connected in parallel is cut and removed one by one using the method of laser trim, or the capacitor array connected in parallel is connected and attached one by one using the method of focused ion beam (FIB), until the transfer function of the circuit output is finally the same as a predetermined desired value, i.e. the capacitance reaches a matched result. However, regardless whether laser trim or FIB, additional manual resources are required to measure and calibrate the chipped ICs, and it will cost additional expenditure and a great deal of time, thus the manufacturing cost will be increased. Therefore, if the work of calibration compensation for capacitance mismatch can be integrated into the IC to achieve the effect of self-calibration, it would be a great help for IC design.

Taiwan Patent Application No. 92133509 discloses a self-calibration circuit as shown in FIG. 1, wherein a plurality of analog voltages are outputted to a sample and hold (S/H) and shift circuit 102 in sequence through a DAC 104; and then the input voltage is compared with the previous voltage by a comparator 100, to determine whether or not the selector 108 is used to compensate the capacitance of the DAC 104. The control of the compensation capacitance is determined by the counters 111–113. The disadvantages of the method are as follows:

First, an S/H and shift circuit 102 comprising an S/H circuit and a real-time switching circuit is required for the original design, which increases the complexity of the circuit design.

Second, a plurality of analog voltages corresponding to digital codes should be generated by the DAC 104 for comparison, and the voltage source and the precision of this design are problematic. Moreover, the circuit design is very complicated.

Third, repeated modification steps for each of the digital codes are needed in this method, thus the clock operation time required is quite long, and the hardware area of the digital circuit is very large.

SUMMARY OF THE INVENTION

Accordingly, an object of the present invention is to provide a self-calibration circuit for capacitance mismatch, wherein the calibration for capacitance mismatch is integrated into the IC, thus achieving the effect of self-calibration. The advantages of the self-calibration circuit include: simplification of the circuit design, simple design and easy integration, a relatively short clock operation time, a small circuit hardware area, lower manufacturing cost, suitability for various ICs requiring a high degree of capacitance matching, and no additional power consumption when the original system is under normal operation.

In order to achieve the above object and others, a self-calibration circuit for capacitance mismatch is provided, which comprises a sample-and-hold (S/H) circuit, a comparator, and a switch control circuit. The S/H circuit comprises a compensation capacitor array, a target capacitor, and a reference capacitor and provides an output voltage. The output voltage is an operation result based on the capacitance of the target capacitor, of the reference capacitor, and the equivalent capacitance of the compensation capacitor array. The comparator provides a comparison signal according to whether the output voltage of the S/H circuit is positive or negative. The switch control circuit provides a compensation control signal to the compensation capacitor array to control the equivalent capacitance of the compensation capacitor array, and adjusts the compensation control signal according to the comparison signal for each cycle of a clock signal such that the result of the target capacitance added to the equivalent capacitance of the array gradually approximates the reference capacitance with each cycle of the clock signal.

In an embodiment of the above self-calibration circuit for capacitance mismatch, the predetermined value of the $x^{th}$ compensation capacitance in the above compensation capacitances is equal to that of the $(x+1)^{th}$ compensation capacitance multiplied by 2, where x is a positive integer.

In an embodiment of the above self-calibration circuit for capacitance mismatch, the switch control circuit comprises a shift register, a latch circuit, and a plurality of OR gates. The shift register provides a shift signal, wherein in the $x^{th}$ cycle of the above clock signal, the $x^{th}$ bit of the shift signal is at a first state, and the other bits are at a second state, where x is a positive integer. The latch circuit provides a latch signal, and latches the comparison signal as the $x^{th}$ bit of the latch signal when the $x^{th}$ bit of the shift signal is at the first state. The $x^{th}$ OR gate in the above OR gates receives the $x^{th}$ bit of the shift signal and the $x^{th}$ bit of the latch signal, and the above compensation control signal is generated according to the outputs of the OR gates.

According to the preferable embodiment of the present invention, the above self-calibration circuit for capacitance mismatch forms an S/H circuit directly by a target capacitor, a compensation capacitor array, a reference capacitor, and a switch; thereby, it is unnecessary to employ an additional S/H circuit, and a shift circuit is not required between the S/H circuit and the comparator, thus the complexity of the circuit design can be simplified.

As for the above self-calibration circuit for capacitance mismatch, a DAC is not required to generate a plurality of analog voltages in sequence, and only a fixed reference voltage, a calibration activating signal, and a clock signal are needed for the whole circuit, thus the design is simple and the circuit is easy to be integrated. Moreover, the above self-calibration circuit for capacitance mismatch employs the approximation compensation with the comparison value between the target capacitor and the reference capacitor, so as to achieve the object of capacitance match and greatly simplify the calibration process, thus the clock operation time is short, the circuit hardware area is small, and the manufacturing cost is saved.

The above self-calibration circuit for capacitance mismatch is not limited to the analog-to-digital converter (ADC) or DAC, and so is suitable for various ICs requiring a high degree of capacitance matching. Finally, the above self-calibration circuit for capacitance mismatch will latch the calibration result after the self-calibration action has completed; after that, it will not operate any more, thus there will be no additional power consumption when the original system is under normal operation.

In order to the make the aforementioned and other objects, features, and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
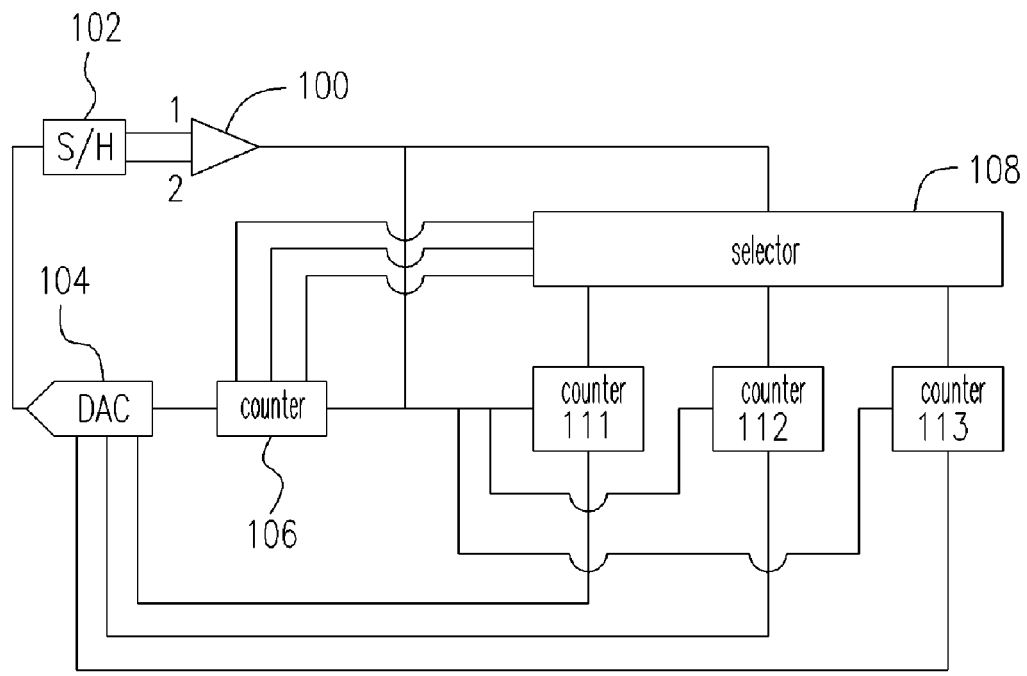
FIG. 1 is an architectural view of a conventional DAC with a self-calibration circuit for capacitance mismatch.
Figure 2:
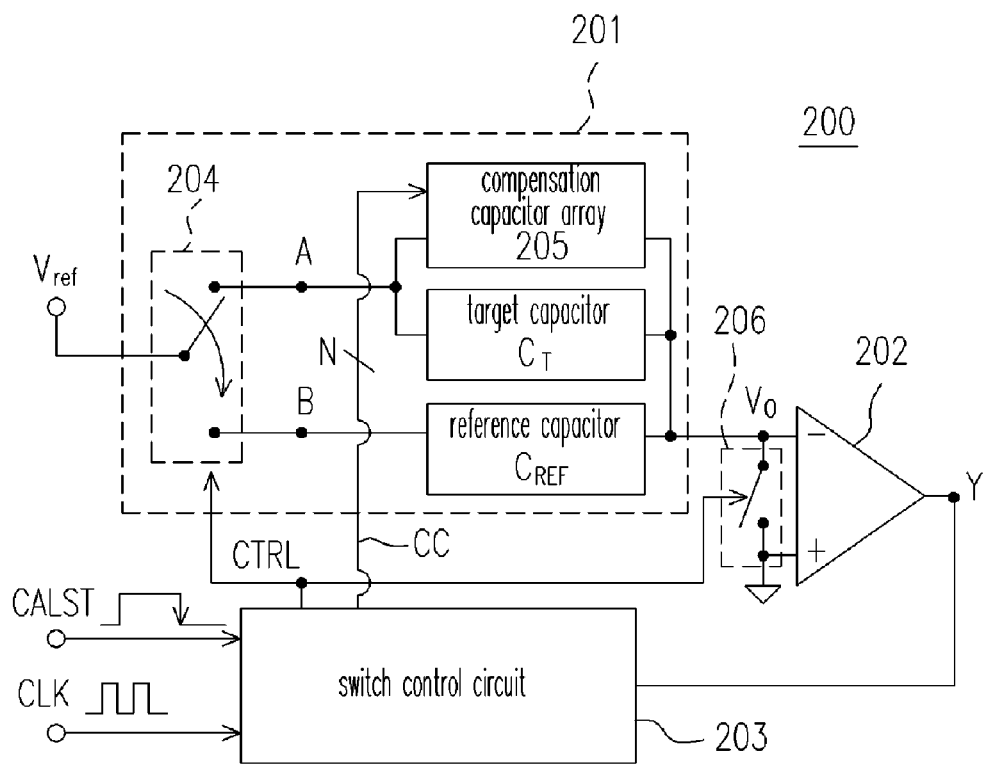
FIG. 2 is an architectural view of a self-calibration circuit for capacitance mismatch according to an embodiment of the present invention.

FIG. 2 is an architectural view of a self-calibration circuit for capacitance mismatch 200 according to an embodiment of the present invention. The construction architecture of the self-calibration circuit 200 is described first below, and then the operating process is described in detail.

The self-calibration circuit 200 mainly includes a sample-and-hold (S/H) circuit 201, a comparator 202, and a switch control circuit 203. The S/H circuit 201 includes a switch 204, a compensation capacitor array 205, a target capacitor $C_T$, and a reference capacitor $C_{REF}$, and provides an output voltage Vo.

The switch 204 is controlled by a switch control signal CTRL. If the switch control signal CTRL is at a first state (logic 1 in this embodiment), the switch 204 connects the reference voltage Vref and the connection point B; if the switch control signal CTRL is at a second state (logic 0 in this embodiment), the switch 204 connects the reference voltage Vref and the connection point A. The switch control signal CTRL is generated by the switch control circuit 203 according to the calibration activating signal CALST, which will be described in more detail below.

The output voltage Vo of the S/H circuit 201 is in theory an operation result based on the capacitance of the target capacitor $C_T$, of the reference capacitor $C_{REF}$, and the equivalent capacitance of the compensation capacitor array 205. In this embodiment, the output voltage Vo is directly proportional to $C_T+C_E-C_{REF}$, wherein $C_E$ is the equivalent capacitance of the compensation capacitor array 205. The output voltage Vo will be described in more detail below.

As for the comparator 202, the inverting input (marked as −) is coupled to the output of the S/H circuit 201; the non-inverting input (marked as +) is grounded; and the output is coupled to the switch control circuit 203. The comparator 202 is used for comparing the voltages of two inputs. If the output voltage Vo of the S/H circuit 201 is positive (larger than the ground voltage), the comparator 202 will output a comparison signal Y of the second state. On the other hand, if the output voltage Vo of the S/H circuit 201 is zero or negative (equals to or smaller than the ground voltage), the comparator 202 will output a comparison signal Y of the first state.

The self-calibration circuit 200 of this embodiment further includes a switch 206 coupled between two inputs of the comparator 202. The switch 206 is turned on when the switch control signal CTRL is at the first state, and is turned off when the switch control signal CTRL is at the second state.

The switch control circuit 203 provides a compensation control signal CC to the compensation capacitor array 205 to control the equivalent capacitance $C_E$ of the compensation capacitor array 205, and adjusts the compensation control signal CC according to the comparison signal Y for each cycle of a clock signal CLK, such that the result of the equivalent capacitance $C_E$ added to the target capacitor $C_T$ gradually approximates the reference capacitor $C_{REF}$ with each cycle of the clock signal CLK. This is also the main object of the present embodiment.

Figure 3:
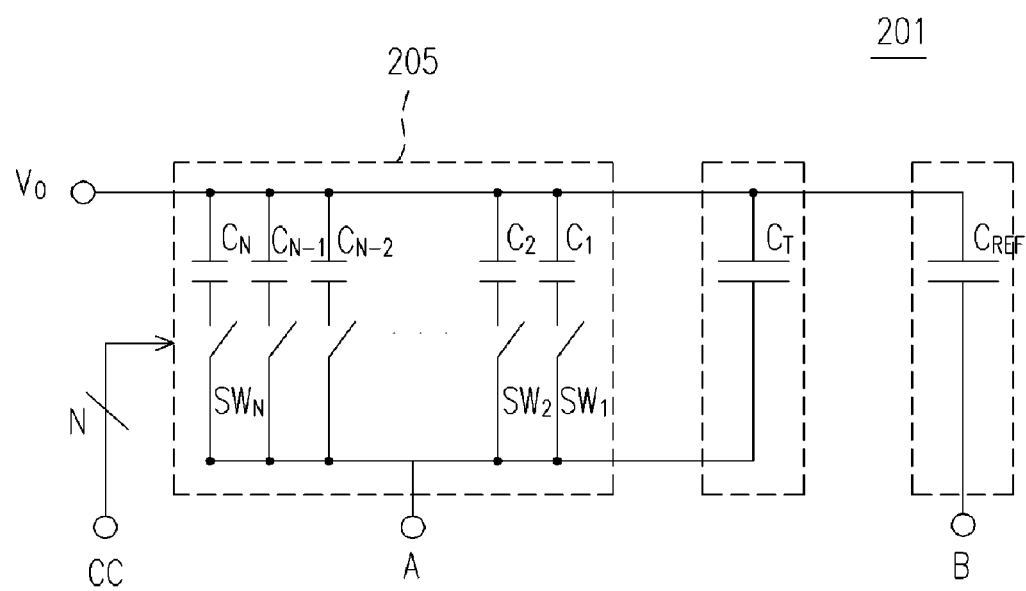
FIG. 3 is a detailed architectural view of the sample-and-hold (S/H) circuit of FIG. 2.

FIG. 3 depicts the detailed structure of the compensation capacitor array 205, the target capacitor $C_T$, and the reference capacitor $C_{REF}$. As shown in FIG. 3, the compensation capacitor array 205 includes a plurality of compensation capacitors ($C_1, C_2, \ldots, C_N$) and a plurality of switches ($SW_1, SW_2, \ldots, SW_N$). Each of the compensation capacitors $C_1$–$C_N$ is corresponding to each of the switches $SW_1$–$SW_N$. Each compensation capacitor $C_1$–$C_N$ is coupled to the output of the S/H circuit 201; and each switch $SW_1$–$SW_N$ is coupled between the corresponding compensation capacitor and a connection point A, and is controlled by one bit in the compensation control signal CC. In this embodiment, the switches $SW_1$–$SW_N$ are turned on when the corresponding bits are at the first state, and turned off when the corresponding bits are at the second state. Moreover, the target capacitor $C_T$ is coupled between the output of the S/H circuit 201 and the connection point A, whereas the reference capacitor $C_{REF}$ is coupled between the output of the S/H circuit 201 and the connection point B.

The predetermined value of the target capacitor $C_T$ is smaller than that of the reference capacitor $C_{REF}$. The compensation capacitors $C_1$–$C_N$ are respectively controlled by the switches $SW_1$–$SW_N$ to determine whether they are to connect in parallel with the target capacitor $C_T$. The compensation capacitors $C_1$–$C_N$ are utilized in the present invention for capacitance calibrating the target capacitor $C_T$, such that $C_T=C_{REF}$, achieving the requirement of capacitance matching.

In order to make the sum of the equivalent capacitance of the compensation capacitor array 205 and the target capacitor $C_T$ to gradually approximate the reference capacitor $C_{REF}$, the proposed predetermined values of various capacitors in FIG. 3 are given below.

For the selection of the predetermined value of the target capacitor $C_T$, it is proposed to take the standard capacitance deviations of the manufacturing process as a reference. For example, if the standard capacitance deviations of the manufacturing process is DELTA (e.g., 1.0%), the predetermined value of the target capacitor $C_T$ is proposed to equal to that of the reference capacitor $C_{REF}$ multiplied by (1-DELTA).

The compensation capacitors $C_1$–$C_N$ are proposed to be arranged in sequence from large to small, that is, the predetermined value of the compensation capacitor $C_x$ is larger than that of the compensation capacitor $C_{x+1}$, where x is an integer and $1 \leq x < N$. In accordance with the self-calibration flow described below, the latter compensation will be carried out more and more finely; thus, achieving the effect of gradual approximation. In order to obtain the minimum N value to save operation time and hardware area, binary approximation is employed, thus the predetermined value of the compensation capacitors is $C_1=2*C_2=4*C_3=8*C_4=\ldots=2^{(N-1)}*C_N$.

The predetermined value of the first compensation capacitor $C_1$ is proposed to be $C_1=C_T/(2^m)$, $m<\log_2(1/DELTA)-1$, wherein DELTA is the standard capacitance deviation of the manufacturing process. Thus, the complete calibrating compensation can be achieved, $C_T=C_{REF}$. The number of compensation capacitors and the minimum predetermined value of the compensation capacitor $C_N$ are determined according to the smallest size allowable by the capacitor layout in the manufacturing process. The more compensation capacitors there are, the more precise the result of the automatic calibration will be.

The above predetermined capacitance values are provided only for reference, and the present invention is not limited to the above proposed values and formulas. In addition, the reference capacitor $C_{REF}$ can be formed with a plurality of capacitors connected in parallel, besides being a single capacitor.

Figure 4:
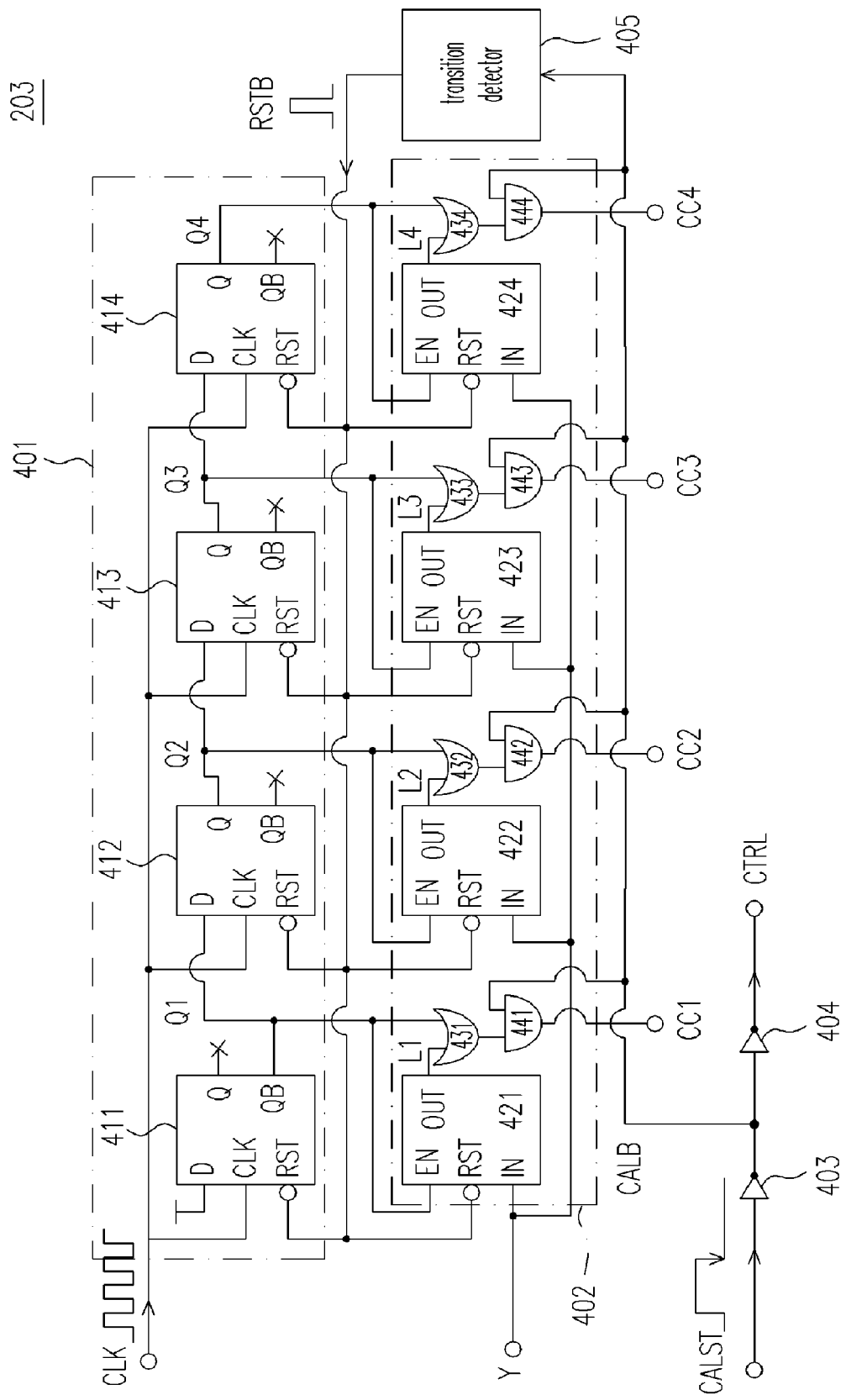
FIG. 4 is a detailed architectural view of the switch control circuit of FIG. 2.

FIG. 4 is an architectural view of the switch control circuit 203 of this embodiment. As shown in FIG. 4, the switch control circuit 203 includes a shift register 401, a latch circuit 402, OR gates 431–434, AND gates 441–444, inverters 403, 404, and a transition detector 405. In FIG. 4, an example of a 4 bit (CC1–CC4) control signal CC is taken, corresponding to 4 compensation capacitors $C_1$–$C_4$. The number of the compensation capacitors and the number of bits of the corresponding compensation control signal are not limited in the present invention.

The shift register 401, used for providing shift signals Q1–Q4, includes four delay flip-flops (D flip-flop) 411–414, wherein each of the D flip-flops 411–414 receives a clock signal CLK through the clock end CLK, and receives a reset signal RSTB through the reset end RST. The input end D of the first D flip-flop 411 is always maintained at the first state, and provides the first bit Q1 of the shift signal through the inverting output QB. The other $x^{th}$ D flip-flop 41$x$ receives the $(x-1)^{th}$ bit $Q(x-1)$ of the shift signal through the input end D, and provides the $x^{th}$ bit Qx of the shift signal through the non-inverting output Q. In such a manner, at the $x^{th}$ cycle of the clock signal CLK, the $x^{th}$ bit Qx of the shift signal is at the first state, and the other bits are at the second state, where x is a positive integer from 1 to 4.

The latch circuit 402, used for providing latch signals L1–L4, includes latches 421–424; wherein the $x^{th}$ latch 42$x$ receives the $x^{th}$ bit Qx of the shift signal through the enable end EN, receives a reset signal RSTB through the reset end RST, receives the comparison signal Y through the input end IN, and outputs the $x^{th}$ bit Lx of the latch signal through the output end OUT. The latch 42$x$ will latch the comparison signal Y as the $x^{th}$ bit Lx of the latch signal when the $x^{th}$ bit Qx of the shift signal is at the first state; and will keep the original latch value and always stay in a stable state when the $x^{th}$ bit Qx of the shift signal is at the second state. This latch action aims at maintaining the calibration result of the previous clock cycle, and the details will be described in the following circuit operation flow.

In the OR gates 431–434, the $x^{th}$ OR gate 43$x$ receives the $x^{th}$ bit Qx of the shift signal and the $x^{th}$ bit Lx of the latch signal. The inverter 403 receives a calibration activating signal CALST. Among the AND gates 441–444, each of the AND gates receives the output signal of one of the OR gates 431–434 and the output signal CALB of the inverter 403, and outputs one bit (CC1–CC4) of the compensation control signal CC. When the output signal CALB of the inverter 403 switches from the second state to the first state, i.e. when automatic calibration starts, the transition detector 405 outputs the reset signal RSTB to the shift register 401 and the latch circuit 402 for resetting the shift signals Q1–Q4 and the latch signals L1–L4. Finally, the inverter 404 receives the output signal CALB of the inverter 403, and outputs the switch control signal CTRL to the switches 204 and 206 in FIG. 2.

In this embodiment, logic 1 is taken as the first state; and logic 0 as the second state; however, the present invention is not limited to this. For example, in other embodiments, logic 0 can be used instead as the first state, and logic 1 as the second state. In the field of the present invention, those skilled in the art will understand how to make corresponding modifications to the self-calibration circuit of the present invention, corresponding to the changed logic state, thus it will not be described herein any more.

The operation flow of the self-calibration circuit for capacitance mismatch 200 of this embodiment will be described below.

The self-calibration flow of the self-calibration circuit for capacitance mismatch 200 is actuated by the calibration activating signal CALST, and the signal CALST can be designed to be automatically set by the system or set by the user. When the self-calibration process starts, i.e. the CALST is set to logic 1 (the first state), the switch control circuit 203 first sends out the switch control signal CTRL to shift the switch 204 of FIG. 2 to the connection point B, and meanwhile the switch 206 is turned on, and the inputs of the comparator 202 are both set to be grounded. Therefore, the reference voltage Vref will charge the reference capacitor $C_{REF}$. At this time, since the signal CALB is at logic 0 (the second state), the compensation control signals CC1–CC4 are all at logic 0.

After a period of time, when the calibration activating signal CALST turns back to logic 0, the control signal CTRL will shift the switch 204 to the connection point A, and meanwhile the switch 206 is turned off, and the input end (briefly referred as Point Vo below) of the S/H circuit 201 is shifted to be out of the ground state. Therefore, at this time, the charge stored at Point Vo is $-C_{REF}*V_{ref}$.

When the switch 204 is shifted to the connection point A, i.e., the calibration activating signal CALST reverts to logic 0 from logic 1, the transition detector 405 is actuated by the signal CALB to send out a reset signal RSTB to reset the shift register 401 and the latch circuit 402. Therefore, Q1 is at logic 1, and Q2–Q4 are at logic 0; CC1 is at logic 1, and CC2–CC4 are at logic 0. At this time, it is the first cycle of the clock signal CLK. Since the Q1 is at logic 1, the latch 421 is enabled. On the other hand, since the CC1 is at logic 1, the switch $SW_1$ of the compensation capacitor $C_1$ is turned on. At this time, Vref turns to charge $C_T+C_1$, thus the charge stored at Point Vo is changed to be $(C_T+C_1-C_{REF})*V_{ref}$, and the voltage of Point Vo is $(C_T+C_1-C_{REF})*V_{ref}/(C_T+C_1)$.

If the output voltage Vo of the S/H circuit 201 is larger than 0, Vo>0, it indicates that $C_T+C_1>C_{REF}$, the comparison signal Y is at logic 0 and connected to the latch 421. At this time, the output L1 of the latch 421 is at logic 0. Coming to the second cycle of the clock signal CLK, Q1 is at logic 0; Q2 is at logic 1; and Q3–Q4 are at logic 0. At this time, the compensation control signal CC1 is determined by the logic 0 outputted by the latch 421 to turn off the switch $SW_1$.

On the other hand, if the output voltage Vo<0, it indicates that $C_T+C_1<C_{REF}$, the comparison signal Y is at logic 1 and is connected to the latch 421. At this time, the output L1 of the latch 421 is at logic 1. Coming to the second cycle of the clock signal CLK, Q1 is at logic 0; Q2 is at logic 1; and Q3–Q4 are at logic 0. At this time, the value of the CC1 is determined by the logic 1 outputted by the latch 421 to keep the switch $SW_1$ turned on.

At the second cycle of the clock signal CLK, Q1 is at logic 0; Q2 is at logic 1; and Q3–Q4 are at logic 0. Thus, the switch $SW_2$ of the compensation capacitor $C_2$ is turned on, and the latch 422 is enabled.

At this time, if the switch $SW_1$ is turned off, the Vref turns to charge $C_T+C_2$, therefore the voltage at Point Vo will be changed to be $(C_T+C_2-C_{REF})*V_{ref}/(C_T+C_2)$.

If the output voltage Vo>0, it indicates that $C_T+C_2>C_{REF}$; the comparison signal Y is at logic 0 and is connected to the latch 422. At this time, the output L2 of the latch 422 is at logic 0. When it comes to the third cycle of the clock signal CLK, Q1–Q2 are at logic 0; Q3 is at logic 1; and Q4 is at logic 0. At this time, the value of CC2 will be determined by the logic 0 outputted by the latch 422, and the switch $SW_2$ is turned off, but the $SW_1$ will not be influenced (because the enable end EN of the latch 421 is at logic 0).

If the output voltage Vo<0, it indicates that $C_T+C_2<C_{REF}$, the comparison signal Y is at logic 1 and is connected to the latch 422. At this time, the output L2 of the latch 422 is at logic 1. Coming to the third cycle of the clock signal CLK, Q1–Q2 are at logic 0; Q3 is at logic 1; and Q4 is at logic 0. At this time, the value of CC2 is determined by logic 1 outputted by latch 422, and the switch $SW_2$ is kept on, but $SW_1$ will not be influenced (because the enable end EN of the latch 421 is at logic 0).

Instead, if the switch $SW_1$ is turned on, the Vref will turn to charge $C_T+C_1+C_2$, thus the voltage of Point Vo is changed to be $(C_T+C_1+C_2-C_{REF})*V_{ref}/(C_T+C_1+C_2)$.

If the output voltage Vo>0, it indicates that $C_T+C_1+C_2>C_{REF}$, the comparison signal Y is at logic 0 and is connected to the latch 422. At this time, the output L2 of the latch 422 is at logic 0. Coming to the third cycle of the clock signal CLK, Q1–Q2 are at logic 0; Q3 is at logic 1; and Q4 is at logic 0. At this time, the value of the CC2 is determined by logic 0 outputted by the latch 422, and the switch $SW_2$ is turned off, but $SW_1$ will not be influenced (because the enable end EN of the latch 421 is at logic 0).

If the output voltage Vo<0, it indicates that $C_T+C_1+C_2<C_{REF}$, the comparison signal Y is at logic 1 and is connected to the latch 422. At this time, the output L2 of the latch 422 is at logic 1. Coming to the third cycle of the clock signal CLK, Q1–Q2 are at logic 0; Q3 is at logic 1; and Q4 is at logic 0. At this time, the value of CC2 is determined by logic 1 outputted by the latch 422, and the switch $SW_2$ is kept on, but SW1 will not be influenced (because the enable end EN of the latch 421 is at logic 0).

Next, coming to the third cycle of the clock signal CLK, the above calibrating steps are repeated for the switch $SW_3$ and the compensation capacitor $C_3$; and coming to the fourth cycle of the clock signal CLK, the above calibrating steps are repeated for the switch $SW_4$ and the compensation capacitor $C_4$. After four CLK cycles, i.e., after the compensation calibration for $C_4$ has been finished, the target capacitor $C_T$ will be compensated to be approximately equal to the reference capacitor $C_{REF}$.

Figure 5:
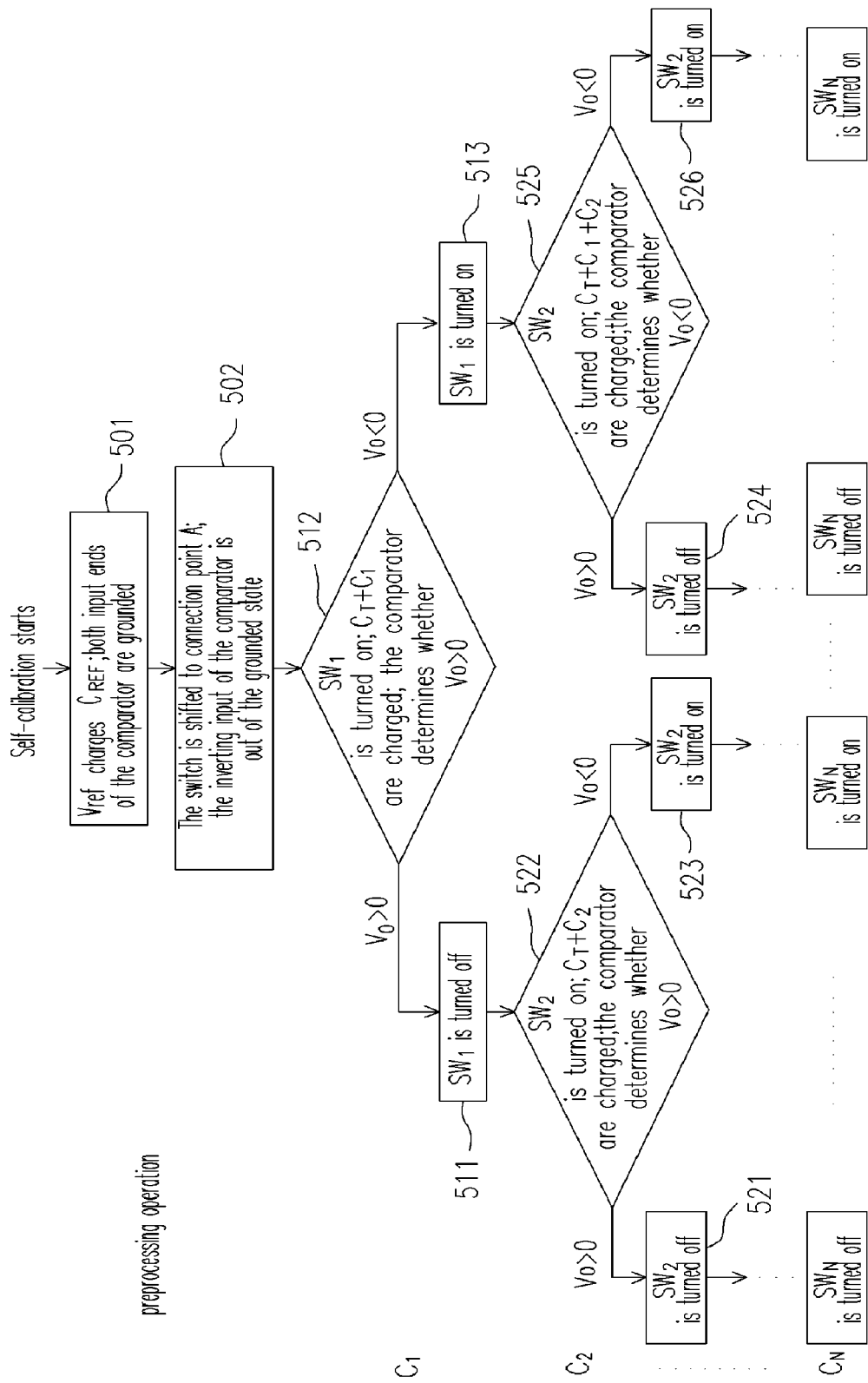
FIG. 5 is a flow chart of the self-calibration of the circuit in FIG. 2.

When compensation has been finished, the capacitor calibration data (on or off state of the switch $SW_x$) will be latched by the self-calibration circuit 200, and the clock signal CLK will stop operating; thus, there will be no burden of additional power consumption, achieving the object of "self-calibration for capacitance mismatch". The above self-calibration flow is combined in FIG. 5. From the flow chart in FIG. 5, one can see more clearly the binary approximation employed in the present invention.

Figure 6:
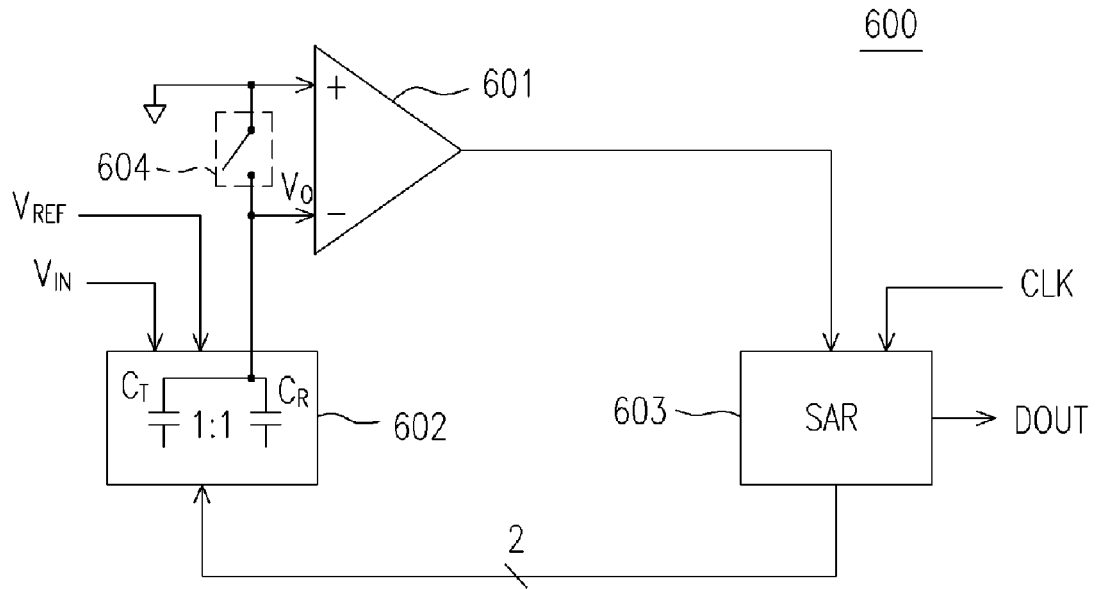
FIG. 6 is an architectural view of a conventional successive approximation analog-to-digital converter (ADC).

The application of the self-calibration circuit for capacitance mismatch disclosed in the present invention will be illustrated with a 1-bit successive approximation ADC (SA-ADC) as an example. FIG. 6 is an architectural view of a conventional SA-ADC 600. The SA-ADC 600 also employs binary approximation, wherein the $V_{REF}$ is a fixed reference voltage, and the input signal $V_{IN}$ cannot be larger than the reference voltage $V_{REF}$. If $V_{IN}>V_{REF}/2$, the output signal DOUT of the SA-ADC 600 is at logic 1, otherwise, the output signal DOUT is at logic 0. CLK is the clock signal. And the predetermined values of the target capacitor $C_T$ and the reference capacitor $C_R$ in the DAC 602 are matched with each other, i.e., $C_T:C_R$ must be 1:1.

When SA-ADC 600 starts operation, the successive approximation register (SAR) 603 outputs a control signal to connect both $C_T$ and $C_R$ to the input signal $V_{IN}$, and meanwhile the input ends of the comparator 601 are both set to be grounded. Therefore, the equivalent charges of Point Vo is $-(C_T+C_R)*V_{IN}=-2*C_T*V_{IN}$. After a period of time, the input end Vo of the comparator 601 is out of the ground state, and meanwhile the control signal outputted by the SAR 603 will connect $C_T$ to $V_{REF}$, and $C_R$ is grounded. Therefore, the equivalent charge of Point Vo is $-(C_T+C_R)*V_{IN}+C_T*V_{REF}=-2*C_R*V_{IN}+C_T*V_{REF}$.

At this time, if $-2*C_R*V_{IN}+C_T*V_{REF}>0$, it indicates that $V_{IN}<V_{REF}/2$; the comparator 601 outputs logic 0, thus the output DOUT of the SAR 603 is at logic 0. Otherwise, if $-2*C_R*V_{IN}+C_T*V_{REF}<0$, it indicates that $V_{IN}>V_{REF}/2$; the comparator 601 outputs logic 1, thus the output DOUT of the SAR 603 is at logic 1. Thus, a 1-bit analog digital inversion can be achieved.

The DAC architecture of the SA-ADC 600 employs a capacitor array with the main object of lowering power consumption, and this architecture is generally used in the current common SA-ADC design. It can be known from the above operation description, if the capacitor $C_T$ mismatches the capacitor $C_R$, i.e., the comparison value is not 1:1, the magnitude relation between $V_{IN}$ and $V_{REF}/2$ cannot be obtained precisely through the comparison of $-2*C_R*V_{IN}+C_T*V_{REF}>0$ or $<0$ carried out by the comparator 601, resulting in incorrect determination, as well as incorrect results outputted by the comparator 601. Therefore, the performance of the SA-ADC 600 is significantly deteriorated.

Figure 7:
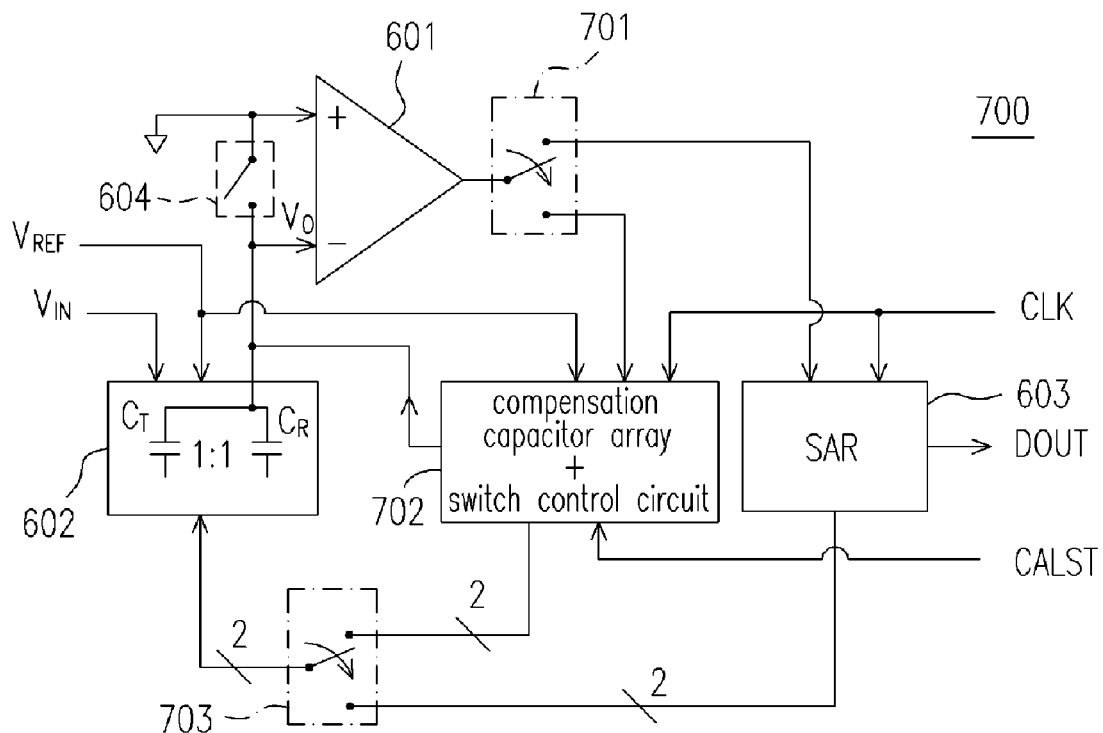
FIG. 7 is an architectural view of the successive approximation ADC of FIG. 6 with a self-calibration circuit for capacitance mismatch according to an embodiment of the present invention.

FIG. 7 is an architectural view of the conventional SA-ADC with the self-calibration circuit for capacitance mismatch according to another embodiment of the present invention, wherein the SA-ADC and the self-calibration circuit can share a comparator 601, a reference voltage $V_{REF}$, and a clock signal CLK. When calibration for capacitance mismatch is to be carried out, it is only needed to shift the switches 701 and 703 to connect to a compensation capacitor array and a switch control circuit 702 of the self-calibration circuit, and one end of the compensation capacitor array is needed to connect to the input end Vo of the comparator 601, thus self-calibration for capacitance mismatch can be carried out. The operation flow of the self-calibration is as described in the former embodiment. After the self-calibration has been finished, the switches 701 and 703 are shifted back to reconnect to the SAR 603. At this time, $C_T$ and $C_R$ have already been calibrated such that $C_T \approx C_R$. The calibrated compensation capacitance is also latched by the switch control circuit, such that the normal SA-ADC analog digital conversion can be carried out, and the circuit is ensured to achieve superior performance.

FIG. 7 shows an example of the self-calibration circuit for capacitance mismatch applied in the SA-ADC, wherein the circuit parts required to be added are only two logic switches (701 and 703), besides the compensation capacitor array and the switch control circuit 702, thus the design is extremely simple. Since the comparator 601, the reference voltage $V_{REF}$ and the clock signal CLK are shared, the self-calibration circuit only needs one additional calibration activating signal CALST, therefore a superior degree of system integration can be achieved. In addition, the self-calibration circuit for capacitance mismatch of FIG. 7 only needs to carry out the capacitance calibration once at the initial start of the system. After the calibration has been finished, the capacitance calibration result is latched by the switch control circuit. And the SA-ADC will return to normal analog-to-digital output operation with the capacitance of the self-calibrated matching result, and meanwhile, the calibration circuit will not be operated any more, thus there will be no additional power consumption.

In summary, the self-calibration circuit for capacitance mismatch provided in the present invention forms an S/H circuit directly by a target capacitor, a compensation capacitor array, a reference capacitor, and a switch, thus it is unnecessary to use an additional S/H circuit, and a shift circuit is not needed between the S/H circuit and the comparator. Therefore, the complexity of the circuit design can be simplified.

As for the above self-calibration circuit for capacitance mismatch, a DAC is not required to generate a plurality of analog voltages in sequence, and only a fixed reference voltage, a calibration activating signal, and a clock signal are required for the whole circuit, thus the design is simple and the circuit is easy to be integrated. Furthermore, the above self-calibration circuit for capacitance mismatch adopts approximation compensation based on comparison of the relative values of the target capacitor and the reference capacitor, achieving the goal of capacitance matching, significantly simplifying the calibration flow; thus the operation time of the clock is short; the circuit hardware area is small; and the manufacturing costs are saved.

The above self-calibration circuit for capacitance mismatch is not limited to ADC or DAC, and it can also be applied to various ICs requiring a high degree of capacitance matching. Finally, the above self-calibration circuit for capacitance mismatch will latch the calibration result after the calibration has been finished, and it will not be operated after that, thus there will be no additional power consumption when the original system is under normal operation.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A self-calibration circuit for capacitance mismatch, comprising:
 a sample-and-hold (S/H) circuit, comprising:
  a compensation capacitor array;
  a target capacitor;
  a reference capacitor;
 a comparator; and
 a switch control circuit; wherein
 the S/H circuit provides an output voltage, the output voltage is an operation result based on the capacitance of the target capacitor, of the reference capacitor, and the equivalent capacitance of the compensation capacitor array;
 the comparator provides a comparison signal according to whether the output voltage of the S/H circuit is positive or negative;
 the switch control circuit provides a compensation control signal to the compensation capacitor array to control the equivalent capacitance of the compensation capacitor array, and adjusts the compensation control signal according to the comparison signal for each cycle of a clock signal, such that the result of the target capacitance added to the equivalent capacitance of the compensation capacitor array gradually approximates the reference capacitance with each cycle of the clock signal.

2. The self-calibration circuit for capacitance mismatch as claimed in claim 1, wherein the output voltage of the S/H circuit is directly proportional to the result of adding the target capacitance to the equivalent capacitance of the compensation capacitor array and then subtracting the reference capacitance.

3. The self-calibration circuit for capacitance mismatch as claimed in claim 2, wherein the compensation capacitor array comprises:
 a plurality of compensation capacitors, each of the compensation capacitors being coupled to the output of the S/H circuit; and
 a plurality of compensation switches, each of the compensation switches being coupled between one of the compensation capacitors and a first connection point, and turned on or turned off according to one bit in the compensation control signal; furthermore,
 the target capacitor is coupled between the output of the S/H circuit and the first connection point;
 the reference capacitor is coupled between the output of the S/H circuit and a second connection point.

4. The self-calibration circuit for capacitance mismatch as claimed in claim 3, wherein the switch control circuit generates a switch control signal according to a calibration activating signal, and the S/H circuit further comprises a first switch; if the switch control signal is at a first state, the first switch connects a reference voltage and the second connection point, and if the switch control signal is at a second state, the first switch connects the reference voltage and the first connection point.

5. The self-calibration circuit for capacitance mismatch as claimed in claim 3, wherein the predetermined value for the manufacturing process of the target capacitor is equal to the predetermined value for the manufacturing process of the reference capacitor multiplied by (1-DELTA), where DELTA is the standard capacitance deviation of the manufacturing process.

6. The self-calibration circuit for capacitance mismatch as claimed in claim 3, further, in the compensation capacitors, the predetermined value of the $x^{th}$ compensation capacitor is larger than the predetermined value of the $(x+1)^{th}$ compensation capacitor, where x is a positive integer.

7. The self-calibration circuit for capacitance mismatch as claimed in claim 6, further, in the compensation capacitors, the predetermined value of the $x^{th}$ compensation capacitor is equal to the predetermined value of the $(x+1)^{th}$ compensation capacitor multiplied by 2, where x is a positive integer.

8. The self-calibration circuit for capacitance mismatch as claimed in claim 3, further, in the compensation capacitors, the predetermined value of the first compensation capacitor is equal to the predetermined value of the target capacitor divided by $2^m$, $m<\log_2(1/DELTA)-1$, where DELTA is the standard capacitance deviation of the manufacturing process.

9. The self-calibration circuit for capacitance mismatch as claimed in claim 3, further, among the compensation capacitors, the minimum predetermined value of a compensation capacitor is determined according to the smallest size allowable by the capacitor layout in the manufacturing process.

10. The self-calibration circuit for capacitance mismatch as claimed in claim 3, wherein the reference capacitor is formed by a plurality of capacitors connected in parallel.

11. The self-calibration circuit for capacitance mismatch as claimed in claim 1, wherein the comparator has an inverting input coupled to the output of the S/H circuit, and a non-inverting input being grounded, and an output being coupled to the switch control circuit.

12. The self-calibration circuit for capacitance mismatch as claimed in claim 11, wherein if the output voltage of the S/H circuit is positive, the comparison signal is at a second state; otherwise the comparison signal is at a first state.

13. The self-calibration circuit for capacitance mismatch as claimed in claim 11, further comprising a second switch, wherein the second switch is coupled between the non-inverting input and the inverting input of the comparator, and is turned on or turned off according to a switch control signal generated by the switch control circuit according to a calibration activating signal.

14. The self-calibration circuit for capacitance mismatch as claimed in claim 1, wherein the switch control circuit comprises:
a shift register, providing a shift signal; in the $x^{th}$ cycle of the clock signal, the $x^{th}$ bit of the shift signal is at a first state, and the other bits are at a second state, where x is a positive integer;
a latch circuit, providing a latch signal, and latching the comparison signal as the $x^{th}$ bit of the latch signal when the $x^{th}$ bit of the shift signal is at the first state; and
a plurality of OR gates, wherein the $x^{th}$ OR gate receives the $x^{th}$ bit of the shift signal and the $x^{th}$ bit of the latch signal, and the compensation control signal is generated according to the outputs of the OR gates.

15. The self-calibration circuit for capacitance mismatch as claimed in claim 14, wherein the shift register comprises a plurality of delay flip-flops (D flip-flop), each of the D flip-flops receives the clock signal through a clock end, wherein the first D flip-flop has an input end kept at the first state, and provides the first bit of the shift signal through an inverting input; and the $x^{th}$ D flip-flop of the other D flip-flops receives the $(x-1)^{th}$ bit of the shift signal through the input end, and provides the $x^{th}$ bit of the shift signal through a non-inverting input.

16. The self-calibration circuit for capacitance mismatch as claimed in claim 14, wherein the latch circuit further comprises a plurality of latches, the $x^{th}$ latch receives the $x^{th}$ bit of the shift signal and the comparison signal, outputs the $x^{th}$ bit of the latch signal, and latches the comparison signal as the $x^{th}$ bit of the latch signal when the $x^{th}$ bit of the shift signal is at the first state.

17. The self-calibration circuit for capacitance mismatch as claimed in claim 14, wherein the switch control circuit further comprises:
a first inverter, for receiving a calibration activating signal;
a plurality of AND gates, each of the AND gates receiving the output signal of one of the OR gates and the output signal of the first inverter, and outputting one bit of the compensation control signal; and
a transition detector, for outputting a reset signal to the shift register and the latch circuit to reset the shift signal and the latch signal when the output signal of the first inverter is changed from the second state to the first state.

18. The self-calibration circuit for capacitance mismatch as claimed in claim 17, wherein the switch control circuit further comprises:
a second inverter, for receiving the output signal of the first inverter and outputting a switch control signal;
furthermore, the self-calibration circuit for capacitance mismatch further comprising:
a first switch, used for connecting a reference voltage and the reference capacitor when the switch control signal is at the first state; and connecting the reference voltage, the compensation capacitor array, and the target capacitor when the switch control signal is at the second state; and
a second switch, coupled between the non-inverting input and the inverting input of the comparator; wherein the second switch is turned on when the switch control signal is at the first state, and turned off when the switch control signal is at the second state.

* * * * *